(12) United States Patent
Min et al.

(10) Patent No.: US 12,707,601 B2
(45) Date of Patent: Aug. 11, 2026

(54) ELECTRONIC DEVICE COMPRISING PRINTED CIRCUIT BOARD STRUCTURE ACCOMMODATING THERMAL INTERFACE MATERIAL

(71) Applicant: Samsung Electronics Co., Ltd., Suwon-si (KR)

(72) Inventors: Bongkyu Min, Suwon-si (KR); Taewoo Kim, Suwon-si (KR); Jinyong Park, Suwon-si (KR); Hyelim Yun, Suwon-si (KR); Hyeongju Lee, Suwon-si (KR); Jiseon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 202 days.

(21) Appl. No.: 18/658,464

(22) Filed: May 8, 2024

(65) Prior Publication Data

US 2024/0292571 A1 Aug. 29, 2024

Related U.S. Application Data

(63) Continuation of application No. PCT/KR2022/014790, filed on Sep. 30, 2022.

(30) Foreign Application Priority Data

Nov. 9, 2021 (KR) ........................ 10-2021-0152962
Dec. 17, 2021 (KR) ........................ 10-2021-0181622

(51) Int. Cl.
*H05K 7/20* (2006.01)
*H05K 1/18* (2026.01)

(52) U.S. Cl.
CPC ........... *H05K 7/20454* (2013.01); *H05K 1/18* (2013.01); *H05K 2201/10037* (2013.01); *H05K 2201/10151* (2013.01); *H05K 2201/10159* (2013.01)

(58) Field of Classification Search
CPC . H10W 70/681; H10W 90/724; H10W 76/60; H10W 40/258; H10W 70/635;
(Continued)

(56) References Cited

U.S. PATENT DOCUMENTS 5,009,311 A * 4/1991 Schenk .................. H05K 3/284
206/706
6,139,309 A 10/2000 Kotaki
(Continued)

FOREIGN PATENT DOCUMENTS

JP H11-129293 A 5/1999
JP 2013-105792 A 5/2013
(Continued)

OTHER PUBLICATIONS

International Search Report with Written Opinion and English translation dated Jan. 13, 2023; International Appln. No. PCT/KR2022/014790.

(Continued)

*Primary Examiner* — Michael A Matey
(74) *Attorney, Agent, or Firm* — Jefferson IP Law, LLP

(57) ABSTRACT

An electronic device is provided. The electronic device includes a base plate, a first component disposed on the base plate, a second component which is disposed on the base plate and provided at a position spaced apart from the first component, an interposer which is connected to the base plate and surrounds the first component and the second component, a cover plate including a cover plate body which is connected to the interposer and covers the first component and the second component, and a cover hole which is formed to penetrate the cover plate body, and a heat dissipation plate including a heat dissipation plate body which is disposed on the cover plate body and faces the first component and the second component, a heat dissipation hole which is formed (Continued)

to penetrate the heat dissipation plate body and communicates with the cover hole, and a flow guide which is formed on the heat dissipation plate body and guides the flow of a thermal interface material.

15 Claims, 8 Drawing Sheets

(58) Field of Classification Search
CPC .................... G06F 1/16; H05K 1/0203; H05K 2201/10378; H05K 1/18; H05K 2201/10037; H05K 2201/10151; H05K 2201/10159; H05K 3/284; H05K 5/064; H05K 7/20454; H05K 7/20463; H05K 1/181; H05K 13/00; H05K 2201/066; H05K 5/06; G02F 1/1339; H01R 13/5216
See application file for complete search history.

(56) References Cited

U.S. PATENT DOCUMENTS 6,617,682 B1 * 9/2003 Ma ........................ H10W 40/10 257/E23.101
8,115,301 B2 2/2012 Kim et al.
9,806,002 B2 10/2017 Choudhury et al.
9,980,381 B2 * 5/2018 Chuah .................... H05K 1/144
10,111,363 B2 * 10/2018 Chen .................. H05K 7/20454
11,031,312 B2 6/2021 Poltorak
2006/0118925 A1 * 6/2006 Macris .................. H10W 76/48 257/667
2007/0127211 A1 * 6/2007 Macris .................. H10W 40/70 257/E23.09
2008/0116586 A1 5/2008 Kim et al.
2008/0137300 A1 * 6/2008 Macris .................. H10W 40/70 257/E23.09
2014/0138057 A1 5/2014 Horng
2014/0160694 A1 * 6/2014 Yoon ..................... G02F 1/1303 361/749
2016/0165748 A1 * 6/2016 Chen .................. H05K 7/20454 29/890.03
2021/0028088 A1 * 1/2021 Brandenburg ........ H10W 40/73

FOREIGN PATENT DOCUMENTS

JP 5546689 B2 7/2014
JP 5808227 B2 11/2015
KR 10-1301782 B1 8/2013
KR 10-1709667 B1 2/2017
KR 10-2082385 B1 2/2020
WO 2020/199043 A1 10/2020

OTHER PUBLICATIONS

Korean Office Action dated Jun. 16, 2026, issued in Korean Application No. 10-2021-0181622.

* cited by examiner

ELECTRONIC DEVICE COMPRISING PRINTED CIRCUIT BOARD STRUCTURE ACCOMMODATING THERMAL INTERFACE MATERIAL

CROSS-REFERENCE TO RELATED APPLICATION(S)

This application is a continuation application, claiming priority under § 365(c), of an International application No. PCT/KR2022/014790, filed on Sep. 30, 2022, which is based on and claims the benefit of a Korean patent application number 10-2021-0152962, filed on Nov. 9, 2021, in the Korean Intellectual Property Office, and of a Korean patent application number 10-2021-0181622, filed on Dec. 17, 2021, in the Korean Intellectual Property Office, the disclosure of each of which is incorporated by reference herein in its entirety.

BACKGROUND

1. Field

The disclosure relates to an electronic device. More particularly, the disclosure relates to an electronic device including a printed circuit board (PCB) structure accommodating a thermal interface material (TIM).

2. Description of Related Art

An electronic device may generate a large amount of heat due to its high performance and implementation of various functions. The heat dissipation performance of the electronic device is essential to secure product stability and reliability. Accordingly, research on technology for dissipating heat generated from the inside of the electronic device in a limited space has been actively conducted.

Heat dissipation technology, which involves injecting a liquid thermal interface material (TIM) into the inner space of the electronic device and hardening the injected TIM, has been known.

The above information is presented as background information only to assist with an understanding of the disclosure. No determination has been made, and no assertion is made, as to whether any of the above might be applicable as prior art with regard to the disclosure.

SUMMARY

To effectively dissipate heat generated from a first component (e.g., a heating component), it is advantageous to surround the first component with a liquid thermal interface material (TIM). The injection position of the TIM is determined by a cover hole formed in a cover plate forming the exterior of an electronic device, making it difficult to adjust the injection position of the TIM as needed. While a liquid TIM is injected through the cover hole provided in the cover plate, the TIM may have a tendency to evenly spread in all directions based on the cover hole. Observing the interior of the electronic device is challenging with the naked eye, making it difficult to monitor the injection of the liquid TIM. This may lead to the possibility of an excessive and unnecessary amount of the TIM being injected.

There is a need for technology to guide the liquid TIM to the first component.

Aspects of the disclosure are to address at least the above-mentioned problems and/or disadvantages and to provide at least the advantages described below. Accordingly, an aspect of the disclosure is to provide an electronic device including a printed circuit board (PCB) structure accommodating a thermal interface material (TIM).

Additional aspects will be set forth in part in the description which follows and, in part, will be apparent from the description, or may be learned by practice of the presented embodiments.

In accordance with an aspect of the disclosure, an electronic device is provided. The electronic device includes a printed circuit board (PCB) structure accommodating a TIM, wherein the PCB structure includes a base plate, a first component disposed on the base plate, a second component disposed on the base plate and provided at a position spaced apart from the first component, an interposer connected to the base plate and configured to surround the first component and the second component, a cover plate including a cover plate body connected to the interposer and configured to cover the first component and the second component and a cover hole formed penetrating the cover plate body, and a heat dissipation plate including a heat dissipation plate body disposed on the cover plate body and facing the first component and the second component, a heat dissipation hole formed penetrating the heat dissipation plate body and communicating with the cover hole, and a flow guide formed on the heat dissipation plate body and configured to guide flow of the TIM.

In accordance with another aspect of the disclosure, an electronic device is provided. The electronic device includes a PCB structure accommodating a TIM, wherein the PCB structure includes a base plate, an interposer connected to the base plate, a cover plate including a cover plate body connected to the interposer and a cover hole formed penetrating the cover plate body, a heat dissipation plate including a heat dissipation plate body disposed on the cover plate body, a heat dissipation hole formed penetrating the heat dissipation plate body and communicating with the cover hole, and a flow guide formed on the heat dissipation plate body and configured to guide flow of the TIM, and a TIM T with which a space is filled, wherein the space is surrounded by the base plate, the interposer, and the cover plate.

In accordance with another aspect of the disclosure, an electronic device is provided. The electronic device includes a PCB structure accommodating a TIM, wherein the PCB structure includes a base plate, a first component disposed on the base plate, a second component disposed on the base plate and provided at a position spaced apart from the first component, an interposer connected to the base plate and configured to surround the first component and second component, a cover plate connected to the interposer and configured to cover the first component and the second component, a heat dissipation plate including a heat dissipation plate body disposed on the cover plate and facing the first component and the second component and a flow guide formed on the heat dissipation plate body and configured to guide flow of the TIM, and a TIM T with which a space is filled, wherein the space is surrounded by the base plate, the interposer, and the cover plate.

According to various embodiments, an electronic device including a printed circuit board (PCB) structure accommodating a thermal interface material (TIM) may increase a heat dissipation effect relative to the amount of the liquid TIM injected by guiding the liquid TIM to the position of a heat dissipation component.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms “a,” “an,” and “the” include plural referents unless the context clearly dictates otherwise. Thus, for example, reference to “a component surface” includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an integrated circuit (IC), or the like.

Figure 1:
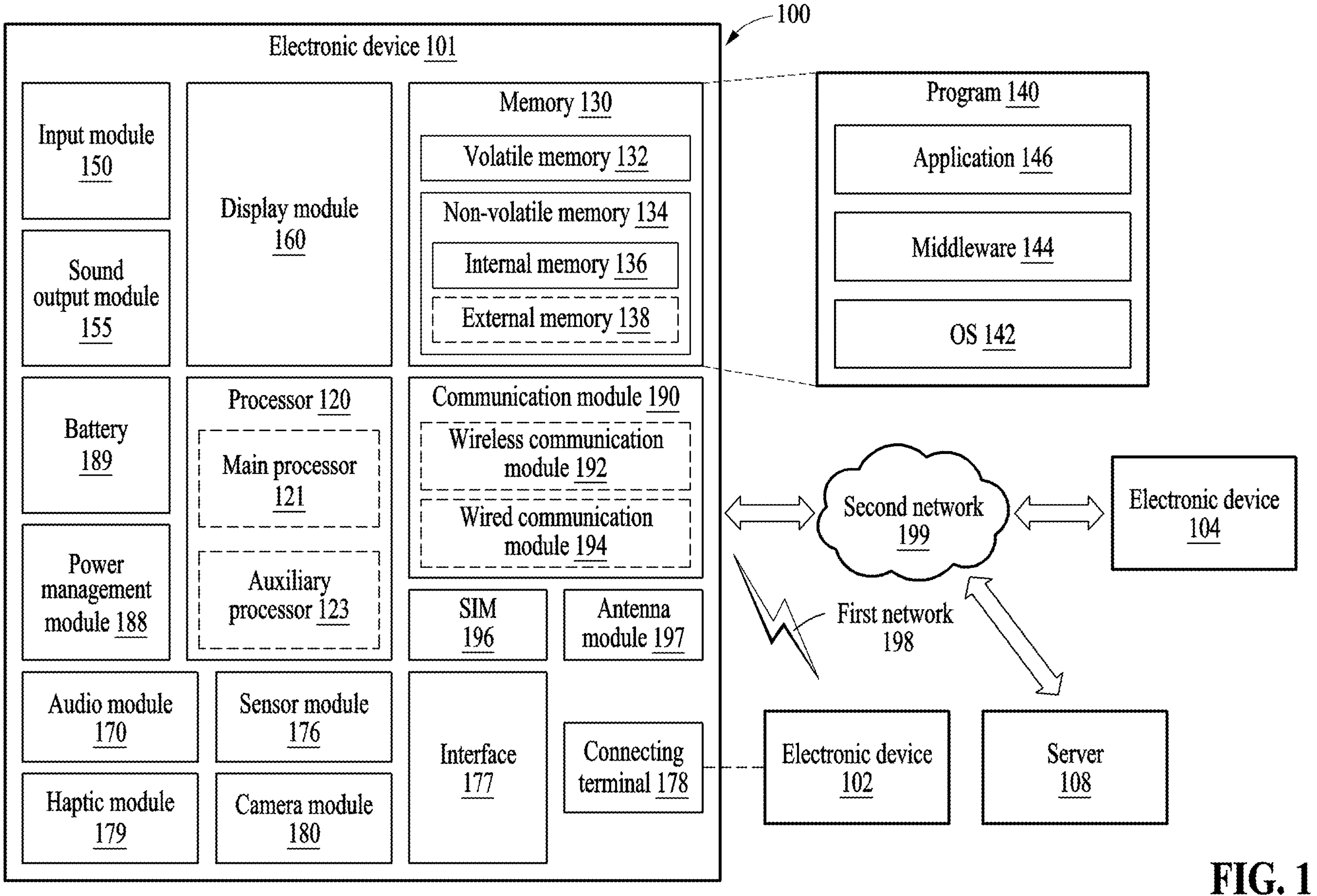
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an electronic device 102 via a first network 198 (e.g., a short-range wireless communication network) or communicate with at least one of an electronic device 104 or a server 108 via a second network 199 (e.g., a long-range wireless communication network). According to an embodiment, the electronic device 101 may communicate with the electronic device 104 via the server 108. According to another embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added to the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computations. According to yet another embodiment, as at least a portion of data processing or computations, the processor 120 may store a command or data received from another component (e.g., the sensor module 176 or the communication module 190) in a volatile memory 132, process the command or the data stored in the volatile memory 132, and store resulting data in a non-volatile memory 134. According to yet another embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to yet another embodiment, the auxiliary processor 123 (e.g., an ISP or a CP) may be implemented as a portion of another component (e.g., the camera module 180 or the communication module 190) that is functionally related to the auxiliary processor 123. According to yet another embodiment, the auxiliary processor 123 (e.g., an NPU) may include a hardware structure specifically for artificial intelligence (AI) model processing. An AI model may be generated by machine learning. Such learning may be performed by, for example, the electronic device 101, in which an AI model is executed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The data includes, for example, software (e.g., the program 140) and input data or output data for a command related thereto. The memory 130 may include the volatile memory 132 or the non-volatile memory 134.

The program 140 may be stored as software in the memory 130 and includes, for example, an operating system (OS) 142, middleware 144, or an application 146.

The input module 150 may receive, from the outside (e.g., a user) of the electronic device 101, a command or data to be used by another component (e.g., the processor 120) of the electronic device 101. The input module 150 includes, for example, a microphone, a mouse, a keyboard, a key (e.g., a button), or a digital pen (e.g., a stylus pen).

The sound output module 155 may output a sound signal to the outside of the electronic device 101. The sound output module 155 includes, for example, a speaker or a receiver. The speaker may be used for general purposes, such as playing multimedia or playing a recording. The receiver may be used to receive an incoming call. According to yet another embodiment, the receiver may be implemented separately from the speaker or as a part of the speaker.

The display module 160 may visually provide information to the outside (e.g., a user) of the electronic device 101. The display module 160 includes, for example, a display, a hologram device, or a projector and a control circuit to control a corresponding one of the display, the hologram device, and the projector. According to yet another embodiment, the display module 160 may include a touch sensor adapted to detect a touch, or a pressure sensor adapted to measure an intensity of a force incurred by the touch.

The audio module 170 may convert a sound into an electric signal or vice versa. According to yet another embodiment, the audio module 170 may obtain the sound via the input module 150 or output the sound via the sound output module 155 or an external electronic device (e.g., an electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. According to yet another embodiment, the sensor module 176 includes, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to yet another embodiment, the interface 177 includes, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to yet another embodiment, the connecting terminal 178 includes, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus, which may be recognized by a user via his or her tactile sensation or kinesthetic sensation. According to yet another embodiment, the haptic module 179 includes, for example, a motor, a piezoelectric element, or an electric stimulator.

The camera module 180 may capture a still image and moving images. According to yet another embodiment, the camera module 180 may include one or more lenses, image sensors, ISPs, or flashes.

The power management module 188 may manage power supplied to the electronic device 101. According to yet another embodiment, the power management module 188 is implemented as, for example, at least a part of a power management integrated circuit (PMIC).

The battery 189 may supply power to at least one component of the electronic device 101. According to yet another embodiment, the battery 189 includes, for example, a primary cell, which is not rechargeable, a secondary cell, which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. According to yet another embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., a LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a millimeter wave (mmWave) band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to yet another embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to yet another embodiment, the antenna module 197 may include an antenna including a radiating element including a conductive material or a conductive pattern formed in or on a substrate (e.g., a printed circuit board (PCB)). According to yet another embodiment, the antenna module 197 may include a plurality of antennas (e.g., array antennas). In such a case, at least one antenna appropriate for a communication scheme used in a communication network, such as the first network 198 or the second network 199, is selected by, for example, the communication module 190 from the plurality of antennas. The signal or power may be transmitted or received between the communication module 190 and the external electronic device via the at least one selected antenna. According to yet another embodiment, another component (e.g., a radio frequency integrated circuit (RFIC)) other than the radiating element may be additionally formed as a part of the antenna module 197.

According to various embodiments, the antenna module 197 may form a mmWave antenna module. According to yet another embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and exchange signals (e.g., commands or data) therebetween via an inter-peripheral communication scheme (e.g., a bus, general purpose input and output (GPIO), serial peripheral interface (SPI), or mobile industry processor interface (MIPI)).

According to yet another embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to yet another embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, requests one or more external electronic devices to perform at least part of the function or the service. The one or more external electronic devices receiving the request may perform the at least part of the function or the service requested, or an additional function or an additional service related to the request, and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology is used, for example. The electronic device 101 may provide ultra-low latency services using, e.g., distributed computing or MEC. In yet another embodiment, the external electronic device 104 may include an Internet-of-things (IoT) device. The server 108 may be an intelligent server using machine learning and/or a neural network. According to yet another embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

The electronic device according to various embodiments may be one of various types of electronic devices. The electronic device includes, for example, a portable communication device (e.g., a smartphone), a computer device, a portable multimedia device, a portable medical device, a camera, a wearable device, or a home appliance device. According to yet another embodiment of the disclosure, the electronic device is not limited to those described above.

It should be appreciated that various embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, "A or B," "at least one of A and B," "at least one of A or B," "A, B or C," "at least one of A, B and C," and "at least one of A, B, or C," may include any one of the items listed together in the corresponding one of the phrases, or all possible combinations thereof. Terms such as "1st" and "2nd," or "first" and "second" may be used to simply distinguish a corresponding component from other components, and do not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module is implemented in a form of an application-specific integrated circuit (ASIC).

Various embodiments of the disclosure as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) invokes at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to yet another embodiment, a method according to various embodiments of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more of other operations may be added.

Figure 2A:
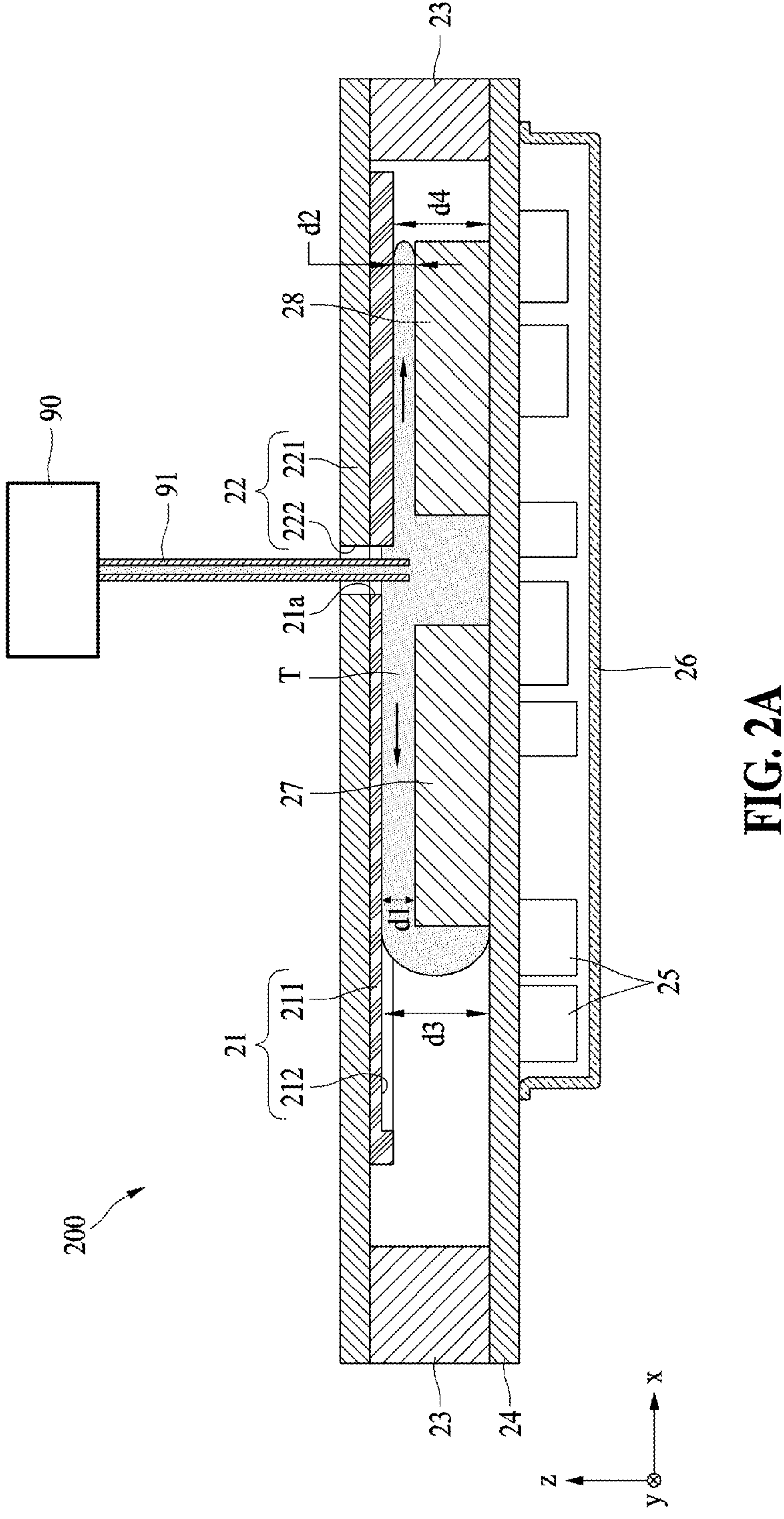
FIG. 2A is a cross-sectional view of an electronic device according to an embodiment of the disclosure.

FIG. 2A is a cross-sectional view of an electronic device according to an embodiment of the disclosure.

Figure 2B:
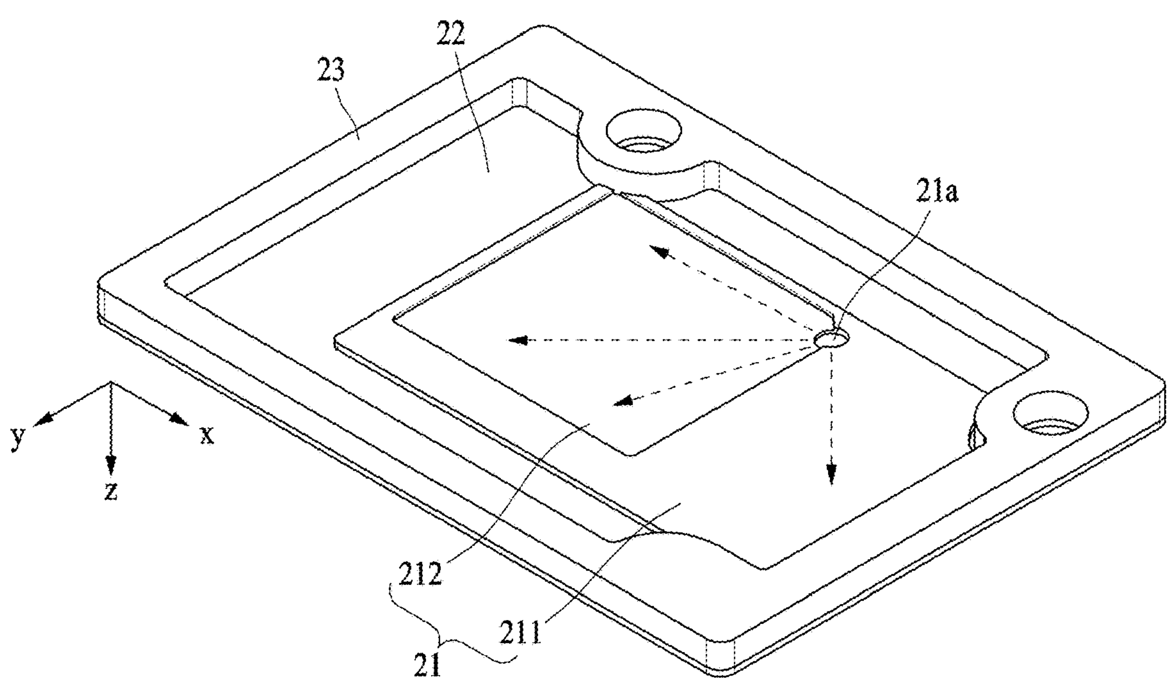
FIG. 2B is a perspective view of a heat dissipation plate and a cover plate of the electronic device according to an embodiment of the disclosure.

FIG. 2B is a perspective view of a heat dissipation plate and a cover plate of the electronic device according to an embodiment of the disclosure.

Figure 2C:
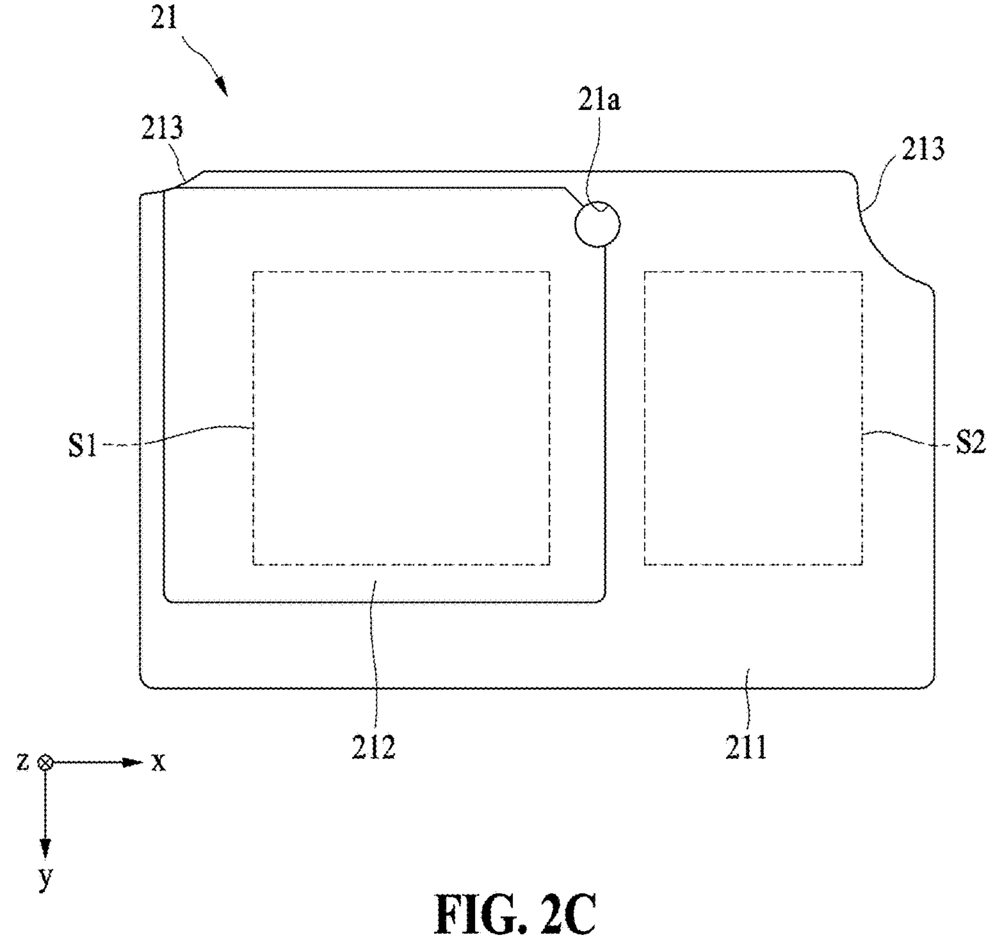
FIG. 2C is a bottom view of the heat dissipation plate according to an embodiment of the disclosure.

FIG. 2C is a bottom view of the heat dissipation plate according to an embodiment of the disclosure.

Referring to FIGS. 2A to 2C, in an embodiment, the electronic device (e.g., the electronic device 101 of FIG. 1) may include a PCB structure 200. The PCB structure 200 may include a thermal interface material (TIM) T inside the PCB structure 200. The PCB structure 200 may include a plurality of components. The PCB structure 200 may include a third component 25 provided outside the PCB structure 200 and a first component 27 and a second component 28 provided inside the PCB structure 200. One component from among the plurality of components may be at a relatively high temperature. Among the plurality of components, a component provided inside the PCB structure 200, provided at a relatively high temperature, and emitting heat around the component may be hereinafter referred to as a "first component". A component that is provided inside the electronic device and not the "first component" may be referred to as a "second component". A component that is provided outside the electronic device may be referred to as a "third component".

In another embodiment, each of the third component 25, the first component 27, and the second component 28 may be one of a processor (e.g., the processor 120 of FIG. 1), a memory (e.g., the memory 130 of FIG. 1), an input module (e.g., the input module 150 of FIG. 1), a sound output module (e.g., the sound output module 155 of FIG. 1), a display module (e.g., the display module 160 of FIG. 1), an audio module (e.g., the audio module 170 of FIG. 1), a sensor module (e.g., the sensor module 176 of FIG. 1), an interface (e.g., the interface 177 of FIG. 1), a connecting terminal (e.g., the connecting terminal 178 of FIG. 1), a haptic module (e.g., the haptic module 179 of FIG. 1), a camera module (e.g., the camera module 180 of FIG. 1), a power management module (e.g., the power management module 188 of FIG. 1), and a battery (e.g., the battery 189 of FIG. 1).

In an embodiment, the first component 27 may be a component of which the temperature is relatively higher than any other components provided inside the PCB structure 200. Although only one second component 28 is illustrated in the diagrams, the number of second components 28 may not be limited thereto.

In yet another embodiment, the PCB structure 200 may include a heat dissipation plate 21, a cover plate 22, an interposer 23, a base plate 24, and an outer cover 26.

In yet another embodiment, the base plate 24 may support a plurality of components (e.g., 25, 27, and 28). The third component 25 may be disposed on one surface of the base plate 24, and the first component 27 and the second component 28 may be disposed on the other surface of the base plate 24. The first component 27 may have a relatively higher temperature than the second component 28. The base plate 24 may have a plate shape. For example, the base plate 24 has a PCB. Although the base plate 24 is illustrated as having a flat plate shape in the diagrams, embodiments are not limited thereto. For example, the base plate includes a curved surface. In another example, the base plate may include at least one bent shape.

In yet another embodiment, the interposer 23 may be connected to the base plate 24. For example, the interposer 23 is attached to the base plate 24. For example, the interposer 23 is formed integrally with the base plate 24. The interposer 23 may have a loop shape forming a closed curve. The interposer 23 may surround at least a portion of the first component 27 and the second component 28.

In yet another embodiment, the cover plate 22 may be connected to the interposer 23. For example, the cover plate 22 is attached to the interposer 23. For example, the cover plate 22 is formed integrally with the interposer 23. The base plate 24, the interposer 23, and the cover plate 22 may create an accommodation space therein. The cover plate 22 may include a cover plate body 221 connected to the interposer 23 and covering the first component 27 and the second component 28 and a cover hole 222 formed penetrating the cover plate body 221. The accommodation space formed by the base plate 24, the interposer 23, and the cover plate 22 may communicate with the outside through the cover hole 222. Although various embodiments are described based on a hole (e.g., the cover hole 222) allowing the accommodation space to communicate with the outside and provided in the cover plate 22, embodiments are not limited thereto. For example, the hole allowing the accommodation space to communicate with the outside is formed in at least one of the cover plate 22, the interposer 23, and the base plate 24.

In yet another embodiment, the heat dissipation plate 21 may absorb some of the heat emitted from the first component 27. The heat dissipation plate 21 may include a heat dissipation plate body 211 attached to the cover plate 22, a heat dissipation hole 21*a* formed penetrating the heat dissipation plate body 211 and communicating with the cover hole 222, a flow guide 212 formed on the heat dissipation plate body 211, and a position fixing portion 213 formed at a corner portion of the heat dissipation plate body 211 and in contact with the interposer 23.

In yet another embodiment, one surface of the heat dissipation plate body 211 may be disposed on the cover plate body 221 and the other surface of the heat dissipation plate body 211 may face the first component 27 and/or the second component 28. The heat dissipation plate body 211 may partially overlap the first component 27 and the second component 28 based on a z-axis direction. A surface, of the heat dissipation plate body 211, facing a +z direction may be attached to the cover plate body 221, and a surface, of the heat dissipation plate body 211, facing a −z direction may face the first component 27 and/or the second component 28.

Figure 3A:
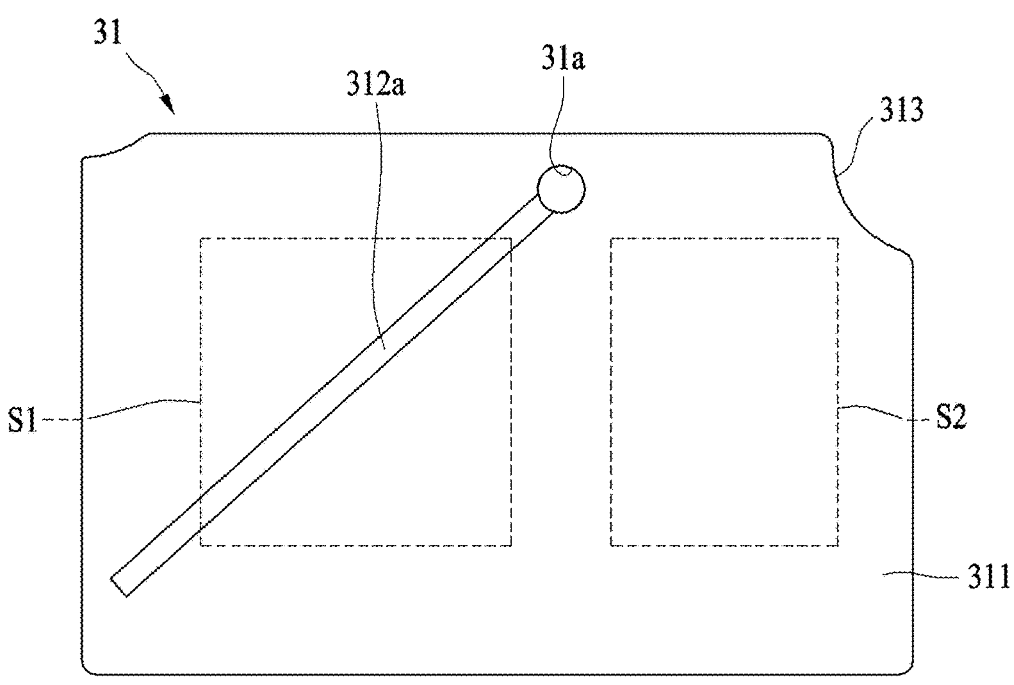
FIG. 3A is a bottom view of a heat dissipation plate according to an embodiment of the disclosure.

In yet another embodiment, the heat dissipation hole 21*a* may be formed in parallel with the cover hole 222. In FIG. 3A, the position where the first component 27 is projected onto the heat dissipation plate body 211 in the +z direction is illustrated as a first position S1 and the position where the second component 28 is projected onto the heat dissipation plate body 211 in the +z direction is illustrated as a second position S2. The heat dissipation hole 21*a* may be positioned between the first position S1 and the second position S2. The first component 27 may be positioned in the −x direction based on the heat dissipation hole 21*a*, and the second component 28 may be positioned in the +x direction based on the heat dissipation hole 21*a*. Of course, at least one second component may also be positioned in the −x direction based on the heat dissipation hole 21*a*.

In yet another embodiment, the flow guide 212 may be recessed in the +z direction from the surface, of the heat dissipation plate body 211, facing the first component 27. A bottom surface of the flow guide 212 may face the first component 27. The flow guide 212 may guide flow of the TIM T. The flow guide 212 may allow the TIM T to flow relatively easily by securing a space through which the TIM T flows.

In yet another embodiment, when the height of the first component 27 is the same as the height of the second component 28, a first distance d1 from the bottom surface of the flow guide 212 to the first component 27 may be greater than a second distance d2 from the heat dissipation plate body 211 to the second component 28. The width of a flow path between the first component 27 and the heat dissipation plate 21 (e.g., the heat dissipation plate body 211) may be greater than the width of a flow path between the second component 28 and the heat dissipation plate 21 (e.g., the heat dissipation plate body 211). A third distance d3 from the bottom surface of the flow guide 212 to the base plate 24 may be greater than a fourth distance d4 from the heat dissipation plate body 211 to the base plate 24. The width of a flow path between the base plate 24 and the flow guide 212 may be greater than the width of a flow path between the base plate 24 and the heat dissipation plate body 211. The flow guide 212 may overlap the first component 27 based on the z-axis direction, which is a penetrating direction of the heat dissipation hole 21*a*.

In yet another embodiment, a liquid TIM T injected into the inner space of the PCB structure 200 may flow in a relatively large amount between the first component 27 and the heat dissipation plate 21, and the liquid TIM T may flow in a direction of effectively surrounding the first component 27.

In yet another embodiment, the flow guide 212 may be connected to the heat dissipation hole 21*a*. The liquid TIM T injected into the PCB structure 200 through the heat dissipation hole 21*a* may spread in all directions based on an xy plane. The TIM T may flow in a relatively large amount in a direction in which the flow guide 212 is connected to the heat dissipation hole 21*a* based on the heat dissipation hole 21*a*.

In yet another embodiment, the thickness of a portion, of the heat dissipation plate body 211, in which the flow guide 212 is formed may be less than the thickness of a portion, of the heat dissipation plate body 211, in which the flow guide 212 is not formed. For example, the thickness of the portion, of the heat dissipation plate body 211, in which the flow guide 212 is formed may be less than or equal to half the thickness of the portion, of the heat dissipation plate body 211, in which the flow guide 212 is not formed.

In yet another embodiment, an area of the flow guide 212 may be greater than an area occupied by the first component 27 on the base plate 24. For example, the flow guide 212 completely covers an upper surface of the first component 27. For example, the flow guide 212 has an approximate quadrangular shape.

In yet another embodiment, the position fixing portion 213 may be in contact with the interposer 23 to fix the position of the heat dissipation plate body 211. The position fixing portion 213 may be recessed from at least one corner of the corners of the heat dissipation plate body 211. For example, although the diagrams illustrate the position fixing portion 213 as being provided at two corners, embodiments are not limited thereto. The position fixing portion 213 may have a shape corresponding to the interposer 23. For example, when the interposer 23 has a convex curved surface, the position fixing portion 213 has a concave curved shape.

In yet another embodiment, the outer cover 26 may cover at least one third component 25 disposed on a surface, of the base plate 24, facing the −z direction.

In yet another embodiment, the TIM T may fill the accommodation space surrounded by the base plate 24, the interposer 23, and the cover plate 22. The TIM T may include mineral oil, grease, gap filler putty, phase change gel, phase change material pads, particle filling epoxy, or the like. However, embodiments are not limited to the foregoing examples, and the TIM T may include various materials having excellent heat conductivity.

In yet another embodiment, the PCB structure 200 may be connected to an injection nozzle 91. The injection nozzle 91 may guide the TIM T from an injection portion 90 to the inner space of the PCB structure 200. The injection portion 90 may accommodate the TIM T. The injection portion 90 may, for example, include a heater (not shown) to keep the TIM T in a liquid state. Although the diagrams illustrate the injection nozzle 91 as being spaced apart from the heat dissipation plate 21 and the cover plate 22, the injection nozzle 91 may fit into the cover hole 222 and/or the heat dissipation hole 21*a*. In another example, a sealing member, such as an O-ring, may be provided between the injection nozzle 91 and the heat dissipation plate 21 and the cover plate 22.

In yet another embodiment, the TIM T may be provided in a solid state by being hardened in the accommodation space. For example, the TIM T provided in the accommodation space is hardened at a temperature of about 120° C. to 150° C. for five to nine minutes. The TIM T may surround the first component 27. For example, surfaces of the first component 27 that are not in contact with the base plate 24 is covered by the TIM T.

In yet another embodiment, the cover hole 222 and/or the heat dissipation hole 21*a* may be closed with shielding tape (not shown). For example, when a sufficient amount of the TIM T is injected into the accommodation space, a worker closes the cover hole 222 and/or the heat dissipation hole 21*a* using the shielding tape to prevent the TIM from leaking.

FIG. 3A is a bottom view of a heat dissipation plate according to an embodiment of the disclosure.

Referring to FIG. 3A, in an embodiment, a heat dissipation plate 31 may include a heat dissipation plate body 311, a flow guide 312*a* recessed from one surface of the heat dissipation plate body 311, a heat dissipation hole 31*a* formed penetrating the heat dissipation plate body 311, and a position fixing portion 313 formed at a corner portion of the heat dissipation plate body 311.

In an embodiment, one end of a flow guide 312*a* may be connected to the heat dissipation hole 31*a*. The flow guide 312*a* may have an elongated shape. The other end of the flow guide 312*a* may be opposite to the heat dissipation hole 31*a* based on the first position S1 indicating the position of a first component. In other words, the flow guide 312*a* may traverse an upper space of the first component.

In another embodiment, a TIM injected through the heat dissipation hole 31*a* may flow in a relatively large amount to a portion in which the flow guide 312*a* is formed. For example, the TIM flows in a relatively large amount in a direction toward the first position S1 rather than a direction toward the second position S2.

Figure 3B:
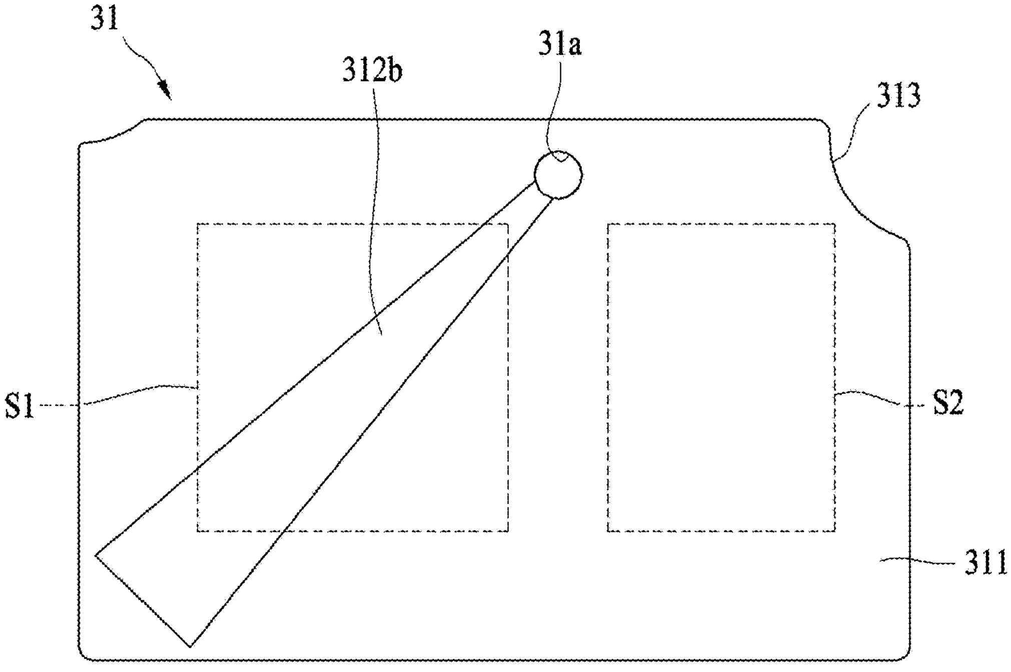
FIG. 3B is the bottom view of the heat dissipation plate according to an embodiment of the disclosure.

FIG. 3B is the bottom view of the heat dissipation plate according to an embodiment of the disclosure.

Referring to FIG. 3B, the heat dissipation hole 31*a* and a flow guide 312*b* extending from the heat dissipation hole 31*a* may be provided in the heat dissipation plate 31 according to an embodiment.

In an embodiment, the flow guide 312*b* may include a shape of which the width gradually increases in a direction away from the heat dissipation hole 31*a*. According to this shape, the flow guide 312*b* may effectively guide flow of the TIM even in the vicinity relatively far from the heat dissipation hole 31*a*.

Figure 4A:
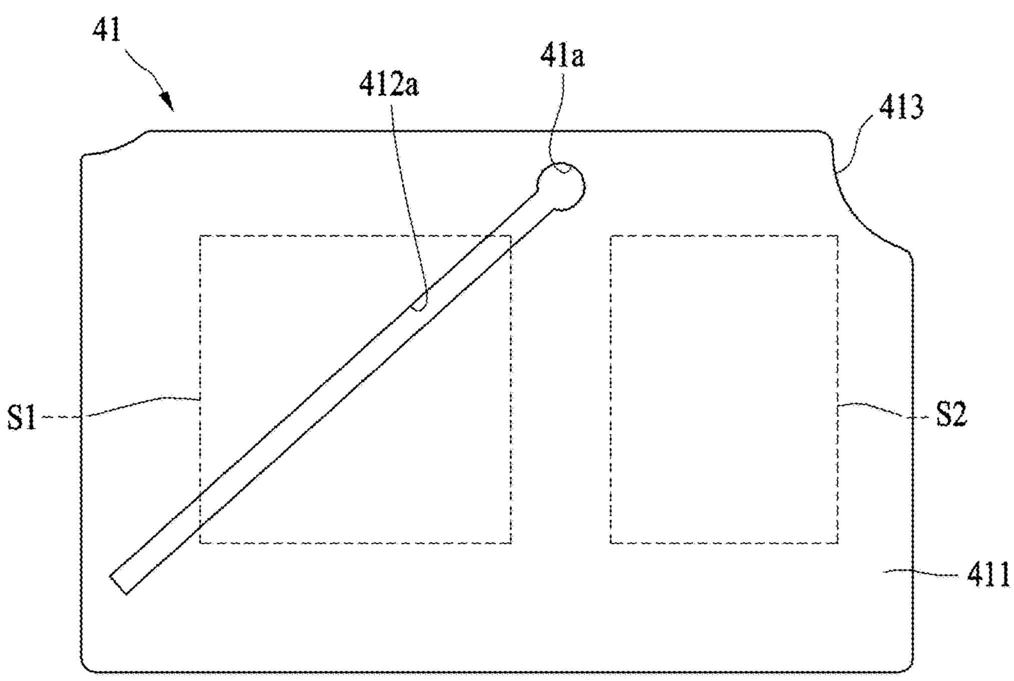
FIG. 4A is a bottom view of a heat dissipation plate according to an embodiment of the disclosure.

FIG. 4A is a bottom view of a heat dissipation plate according to an embodiment of the disclosure.

Referring to FIG. 4A, in an embodiment, a heat dissipation plate 41 may include a heat dissipation plate body 411, a flow guide 412*a* formed in the heat dissipation plate body 411, a heat dissipation hole 41*a* formed penetrating the heat dissipation plate body 411, and a position fixing portion 413 formed at a corner portion of the heat dissipation plate body 411.

In another embodiment, the flow guide 412*a* may be formed penetrating the heat dissipation plate body 411. The flow guide 412*a* may be formed penetrating the heat dissipation plate body 411. A penetrating direction of the flow guide 412*a* may be parallel with a penetrating direction of the heat dissipation hole 41*a*. The flow guide 412*a* may be connected to the heat dissipation hole 41*a* to communicate with the heat dissipation hole 41*a*.

In yet another embodiment, a TIM injected through the heat dissipation hole 41*a* may flow in a relatively large quantity to a portion in which the flow guide 412*a* is formed. For example, the TIM flows in a relatively large amount in a direction toward the first position S1 rather than a direction toward the second position S2.

Figure 4B:
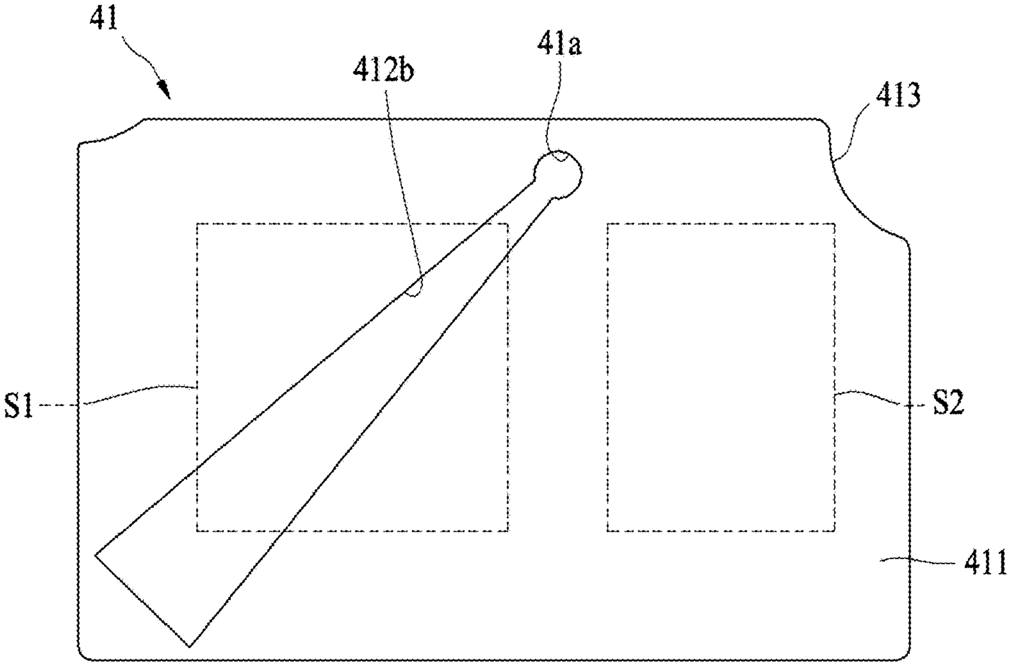
FIG. 4B is the bottom view of the heat dissipation plate according to an embodiment of the disclosure.

FIG. 4B is the bottom view of the heat dissipation plate according to an embodiment of the disclosure.

Referring to FIG. 4B, the heat dissipation hole 41*a* and a flow guide 412*b* extending from the heat dissipation hole 41*a* may be provided in the heat dissipation plate 41 according to an embodiment.

In an embodiment, the flow guide 412*b* may include a shape of which the width gradually increases in a direction away from the heat dissipation hole 41*a*. According to this shape, the flow guide 412*b* may effectively guide the flow of the TIM even in the vicinity relatively far from the heat dissipation hole 41*a*.

Figure 5:
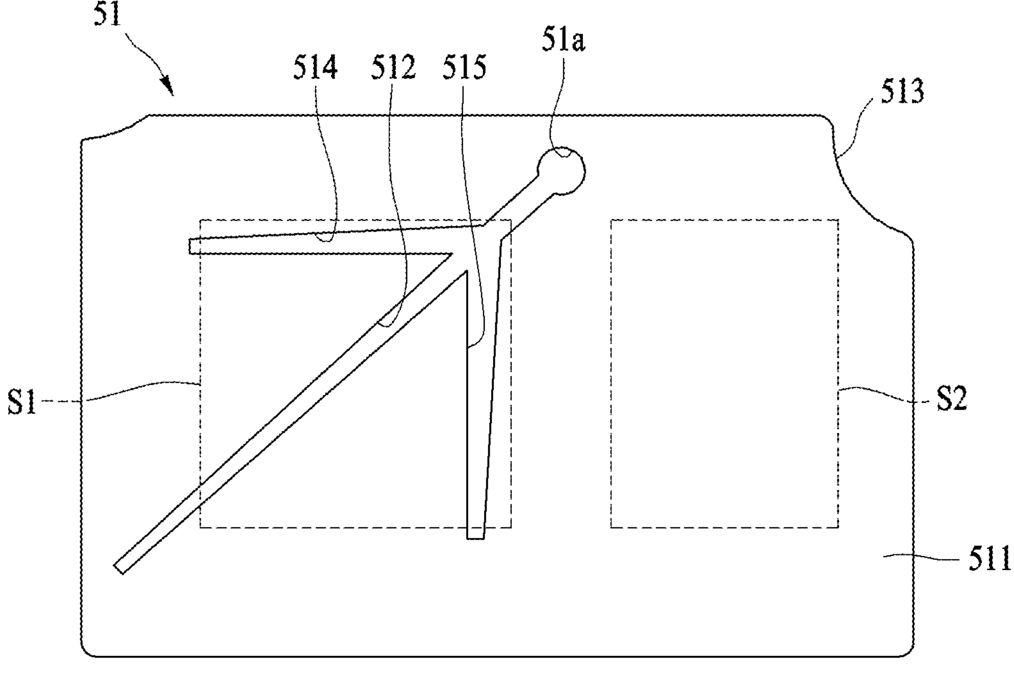
FIG. 5 is a bottom view of a heat dissipation plate according to an embodiment of the disclosure.

FIG. 5 is a bottom view of a heat dissipation plate according to an embodiment of the disclosure.

Referring to FIG. 5, in an embodiment, a heat dissipation plate 51 may include a heat dissipation plate body 511, flow guides 512, 514, and 515 formed penetrating the heat dissipation plate body 511, a heat dissipation hole 51*a* formed penetrating the heat dissipation plate body 511, and a position fixing portion 513 formed at a corner portion of the heat dissipation plate body 511.

In another embodiment, the flow guides 512, 514, and 515 may overlap the first position S1. The flow guides 512, 514, and 515 may include a flow guide 512 extending from the heat dissipation hole 51*a* in a first direction, a first auxiliary guide 514 extending from the flow guide 512 in a second direction intersecting with the first direction, and a second auxiliary guide 515 extending from the flow guide 512 in a third direction intersecting with the first direction. Each of the flow guide 512, the first auxiliary guide 514, and the second auxiliary guide 515 may overlap the first position S1.

In another embodiment, each of the flow guide 512, the first auxiliary guide 514, and the second auxiliary guide 515 may traverse an upper space of a first component. For example, the main guide (flow guide 512) may traverse the upper space of the first component in a diagonal direction, while the first auxiliary guide 514 and the second auxiliary guide 515 each traverse the upper space of the first component in a direction along approximately one edge of the upper space of the first component.

In yet another embodiment, a TIM injected through the heat dissipation hole 51*a* may flow in a relatively large amount to a portion in which the flow guides 512, 514, and 515 are formed. For example, the TIM flows in a relatively large amount in a direction toward the first position S1 rather than a direction toward the second position S2.

Figure 6A:
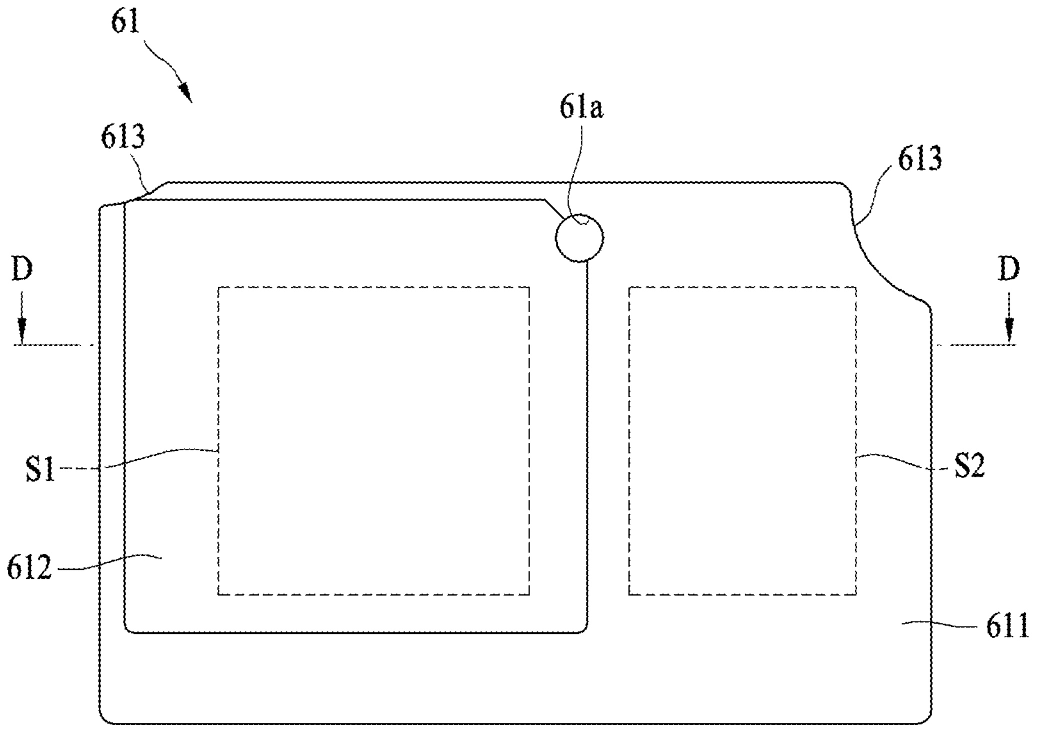
FIG. 6A is a bottom view of a heat dissipation plate according to an embodiment of the disclosure.
Figure 6B:
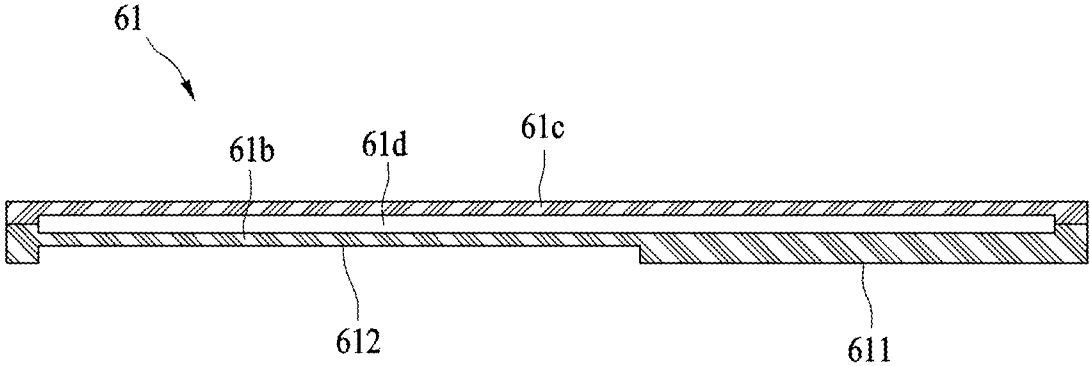
FIG. 6B is a cross-sectional view of the heat dissipation plate taken along line D-D of FIG. 6A according to an embodiment of the disclosure.

FIG. 6A is a bottom view of a heat dissipation plate according to an embodiment of the disclosure, and FIG. 6B is a cross-sectional view of the heat dissipation plate taken along line D-D of FIG. 6A according to an embodiment of the disclosure.

Referring to FIGS. 6A and 6B, in an embodiment, a heat dissipation plate 61 may include a heat dissipation plate body 611, a flow guide 612 recessed from one surface of the heat dissipation plate body 611, a heat dissipation hole 61*a* formed penetrating the heat dissipation plate body 611, and a position fixing portion 613 formed at a corner portion of the heat dissipation plate body 611.

In another embodiment, a TIM injected through the heat dissipation hole 61*a* may flow in a relatively large amount to a portion in which the flow guide 612 is formed. For example, the TIM flows in a relatively large amount in a direction toward the first position S1 rather than a direction toward the second position S2.

In yet another embodiment, the heat dissipation plate 61 may include a bottom plate 61*b* in which the flow guide 612 is formed, a top plate 61*c* connected to the bottom plate 61*b* and disposed on a cover plate (e.g., the cover plate 22 of FIG. 2A), and a heat dissipation space 61*d* provided inside the bottom plate 61*b* and the top plate 61*c*. For example, the heat dissipation space 61*d* is filled with air.

In yet another embodiment, the heat dissipation plate 61 may further include a fluid with which the heat dissipation space 61*d* is filled. For example, the heat dissipation plate 61 is a heat sink or a vapor chamber.

Figure 7:
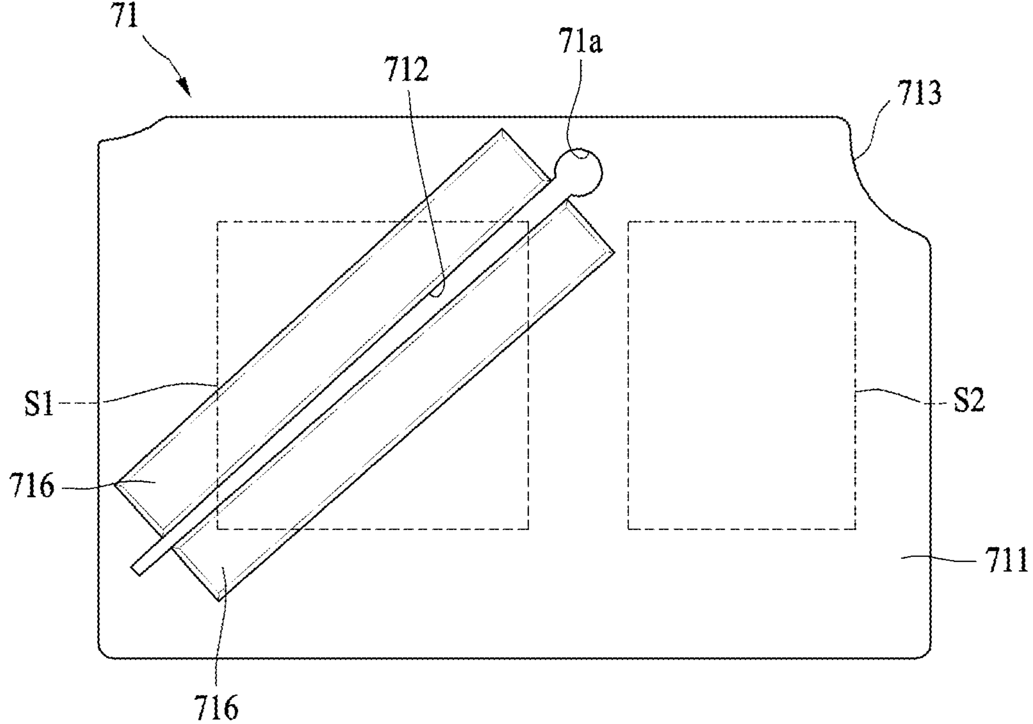
FIG. 7 is a bottom view of a heat dissipation plate according to an embodiment of the disclosure.

FIG. 7 is a bottom view of a heat dissipation plate according to an embodiment of the disclosure.

Referring to FIG. 7, in an embodiment, a heat dissipation plate 71 may include a heat dissipation plate body 711, a flow guide 712 recessed from one surface of the heat dissipation plate body 711, a heat dissipation hole 71*a* formed penetrating the heat dissipation plate body 711, a position fixing portion 713 formed at a corner portion of the heat dissipation plate body 711, and a heat spreader 716 disposed on the heat dissipation plate body 711.

In another embodiment, a TIM injected through the heat dissipation hole 71*a* may flow in a relatively large amount to a portion in which the flow guide 712 is formed. For example, the TIM flows in a relatively large amount in a direction toward the first position S1 rather than a direction toward the second position S2.

In yet another embodiment, the heat spreader 716 may at least partially overlap the first position S1. The heat spreader 716 may be a heat sink or a vapor chamber, for example. The heat spreader 716 may be disposed in parallel with the flow guide 712.

According to various embodiments, a PCB structure 200 may be an electronic device including a PCB structure accommodating a TIM, wherein the PCB structure may include a base plate 24, a first component 27 disposed on the base plate, a second component 28 disposed on the base plate and provided at a position spaced apart from the first component, an interposer 23 connected to the base plate and surrounding the first component and the second component, a cover plate 22 including a cover plate body 221 connected to the interposer and covering the first component and the second component and a cover hole 222 formed penetrating the cover plate body, and a heat dissipation plate 21 including a heat dissipation plate body 211 disposed on the cover plate body and facing the first component and the second component, a heat dissipation hole 21*a* formed penetrating the heat dissipation plate body and communicating with the cover hole, and a flow guide 212 formed on the heat dissipation body and guiding flow of the TIM.

In various embodiments, the flow guide 212 may overlap the first component 27 based on a penetrating direction of the heat dissipation hole.

In various embodiments, the flow guide 212 may be connected to the heat dissipation hole 21*a*.

In various embodiments, the PCB structure may accommodate the TIM, wherein the thickness of a portion, of the heat dissipation plate body 211, in which the flow guide 212 is formed may be less than the thickness of a portion, of the heat dissipation plate body 211, in which the flow guide 212 is not formed.

In various embodiments, the flow guide 212 may be recessed from a surface, of the heat dissipation plate body, facing the first component.

In various embodiments, a distance d3 from a bottom surface of the flow guide to the base plate may be greater than a distance d4 from the heat dissipation plate body to the base plate.

In various embodiments, an area of the flow guide 212 may be greater than an area occupied by the first component 27 on the base plate.

In various embodiments, the flow guide 212 may be formed penetrating the heat dissipation plate body 211.

In various embodiments, the flow guide may include a flow guide 512 extending from the heat dissipation hole in a first direction and an auxiliary guide 514 extending from the main guide (flow guide 512) in a second direction intersecting with the first direction.

In various embodiments, the heat dissipation plate may include a bottom plate 61*b* on which the flow guide is formed, a top plate 61*c* connected to the bottom plate and disposed on the cover plate, and a heat dissipation space 61*d* provided inside the bottom plate and the top plate.

In various embodiments, the heat dissipation plate 61 may further include a heat dissipation fluid with which the heat dissipation space 61*d* is filled.

In various embodiments, a heat dissipation plate 71 may further include a heat spreader 716 disposed on the heat dissipation plate body and overlapping the first component based on a penetrating direction of the heat dissipation hole.

In various embodiments, the PCB structure may further include a TIM T with which an accommodation space is filled, wherein the accommodation space is surrounded by the base plate, the interposer, and the cover plate.

In various embodiments, the TIM T may be provided in a solid state by being hardened inside the accommodation space.

In various embodiments, the TIM T may be injected in a liquid state into a space between the first component and the second component through the cover hole and the heat dissipation hole.

According to various embodiments, a PCB structure 200 may be an electronic device including a PCB structure accommodating a TIM, wherein the PCB structure may include a base plate 24, an interposer 23 connected to the base plate, a cover plate 22 including a cover plate body 221 connected to the interposer and a cover hole 222 formed penetrating the cover plate body, a heat dissipation plate 21 including a heat dissipation plate body 211 disposed on the cover plate body, a heat dissipation hole **21*a* formed penetrating the heat dissipation plate body and communicating with the cover hole, and a flow guide 212** formed on the heat dissipation plate body and guiding flow of the TIM, and a TIM T with which a space is filled, wherein the space is surrounded by the base plate, the interposer, and the cover plate.

In various embodiments, the thickness of a portion, of the heat dissipation plate body 211, in which the flow guide 212 is formed may be less than the thickness of a portion, of the heat dissipation plate body 211, in which the flow guide 212 is not formed.

In various embodiments, the flow guide 212 may be connected to the heat dissipation hole **21*a* and recessed from one surface of the heat dissipation plate body 211**.

In various embodiments, the flow guide 212 may be connected to the heat dissipation hole **21*a* and formed penetrating the heat dissipation plate body 211**.

According to various embodiments, a PCB structure 200 may be an electronic device including a PCB structure accommodating a TIM, wherein the PCB structure may include a base plate 24, a first component 27 disposed on the base plate, a second component 28 disposed on the base plate and provided at a position spaced apart from the first component, an interposer 23 connected to the base plate and surrounding the first component and the second component, a cover plate 22 connected to the interposer and covering the first component and the second component, a heat dissipation plate 21 including a heat dissipation plate body 211 disposed on the cover plate and facing the first component and the second component and a flow guide 212 formed on the heat dissipation plate body and guiding flow of the TIM, and a TIM T with which a space is filled, wherein the space is surrounded by the base plate, the interposer, and the cover plate.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising a printed circuit board (PCB) structure accommodating a thermal interface material (TIM), wherein the PCB structure comprises:
- a base plate;
- a first component disposed on the base plate;
- a second component disposed on the base plate and provided at a position spaced apart from the first component;
- an interposer connected to the base plate and surrounding the first component and the second component;
- a cover plate comprising a cover plate body connected to the interposer and configured to cover the first component and the second component and a cover hole formed penetrating the cover plate body; and
- a heat dissipation plate comprising:
  - a heat dissipation plate body disposed on the cover plate body and facing the first component and the second component,
  - a heat dissipation hole formed penetrating the heat dissipation plate body and communicating with the cover hole, and
  - a flow guide formed on the heat dissipation plate body and configured to guide flow of the TIM.

2. The electronic device of claim 1, wherein the flow guide overlaps the first component based on a penetrating direction of the heat dissipation hole.

3. The electronic device of claim 1, wherein the flow guide is connected to the heat dissipation hole.

4. The electronic device of claim 1, wherein a thickness of a portion, of the heat dissipation plate body, in which the flow guide is formed is less than a thickness of a portion, of the heat dissipation plate body, in which the flow guide is not formed.

5. The electronic device of claim 1, wherein the flow guide is recessed from a surface, of the heat dissipation plate body, facing the first component.

6. The electronic device of claim 5, wherein a distance from a bottom surface of the flow guide to the base plate is greater than a distance from the heat dissipation plate body to the base plate.

7. The electronic device of claim 5, wherein an area of the flow guide is greater than an area occupied by the first component on the base plate.

8. The electronic device of claim 5, wherein the flow guide completely covers an upper surface of the first component.

9. The electronic device of claim 1, wherein the flow guide comprises:
- a main guide extending from the heat dissipation hole in a first direction; and
- an auxiliary guide extending from the main guide in a second direction intersecting with the first direction.

10. The electronic device of claim 1, wherein the heat dissipation plate comprises:
- a bottom plate on which the flow guide is formed;
- a top plate connected to the bottom plate and disposed on the cover plate; and
- a heat dissipation space provided inside the bottom plate and the top plate.

11. The electronic device of claim 10, wherein the heat dissipation plate further comprises a heat dissipation fluid with which the heat dissipation space is filled.

12. The electronic device of claim 1, wherein the heat dissipation plate further comprises a heat spreader disposed on the heat dissipation plate body and overlapping the first component based on a penetrating direction of the heat dissipation hole.

13. The electronic device of claim 1,
- wherein the PCB structure further comprises the TIM with which an accommodation space is filled, and wherein the accommodation space is surrounded by the base plate, the interposer, and the cover plate.

14. The electronic device of claim 13, wherein the TIM is provided in a solid state by being hardened in the accommodation space.

15. The electronic device of claim 13, wherein the TIM is injected in a liquid state into a space between the first component and the second component through the cover hole and the heat dissipation hole.

* * * * *